United States Patent [19]

Bunnell

[11] Patent Number: 4,587,596
[45] Date of Patent: May 6, 1986

[54] HIGH DENSITY MOTHER/DAUGHTER CIRCUIT BOARD CONNECTOR

[75] Inventor: Edward D. Bunnell, Palm Harbor, Fla.

[73] Assignee: AMP Incorporated, Harrisburg, Pa.

[21] Appl. No.: 597,982

[22] Filed: Apr. 9, 1984

[51] Int. Cl.⁴ .............................................. H05K 1/18
[52] U.S. Cl. .................................... 361/398; 361/413; 361/415; 339/17 M; 339/176 MP; 339/176 MF
[58] Field of Search .............................. 361/398, 413; 339/176 MF, 176 MP, 177

[56] References Cited

U.S. PATENT DOCUMENTS

| | | | |
|---|---|---|---|
| 3,401,369 | 9/1968 | Palmateer et al. | 339/17 |
| 3,489,990 | 1/1970 | Parker et al. | 339/75 |
| 3,609,463 | 9/1971 | Laboue | 339/176 MP |
| 3,772,775 | 11/1973 | Bonnke et al. | 29/628 |
| 3,922,054 | 11/1975 | Dechelette | 339/176 MF X |
| 3,967,162 | 6/1976 | Ceresa et al. | 339/61 M |
| 4,116,516 | 9/1978 | Griffin | 339/17 F |
| 4,211,459 | 7/1980 | Madden | 339/176 MP X |

OTHER PUBLICATIONS

Hinrichsmeyer et al, Combined Action Zero Insertion Force Connector, IBM Tech. Disc. Bull., vol. 26, #12, May 1984, pp. 6476 and 6477.

Primary Examiner—R. R. Kucia
Attorney, Agent, or Firm—Russell J. Egan; Robert W. Pitts

[57] ABSTRACT

A high density mother/daughter circuit board connector utilizes a multi-layer flat flexible circuit, each layer of which contains a plurality of patterned arrays of circuit paths extending between spaced contact points, at least some of which are exposed through apertures in overlying layers. The multi-layered circuitry is wrapped around a housing from a mother circuit board face to extend into one side of a daughter board receiving recess. Camming means arranged in the opposite side of the recess drive a daughter circuit board inserted therein transversely of the recess into loaded engagement with the multi-layer circuitry thereby establishing electrical interconnection between the circuitry of the mother and daughter circuit boards.

9 Claims, 7 Drawing Figures

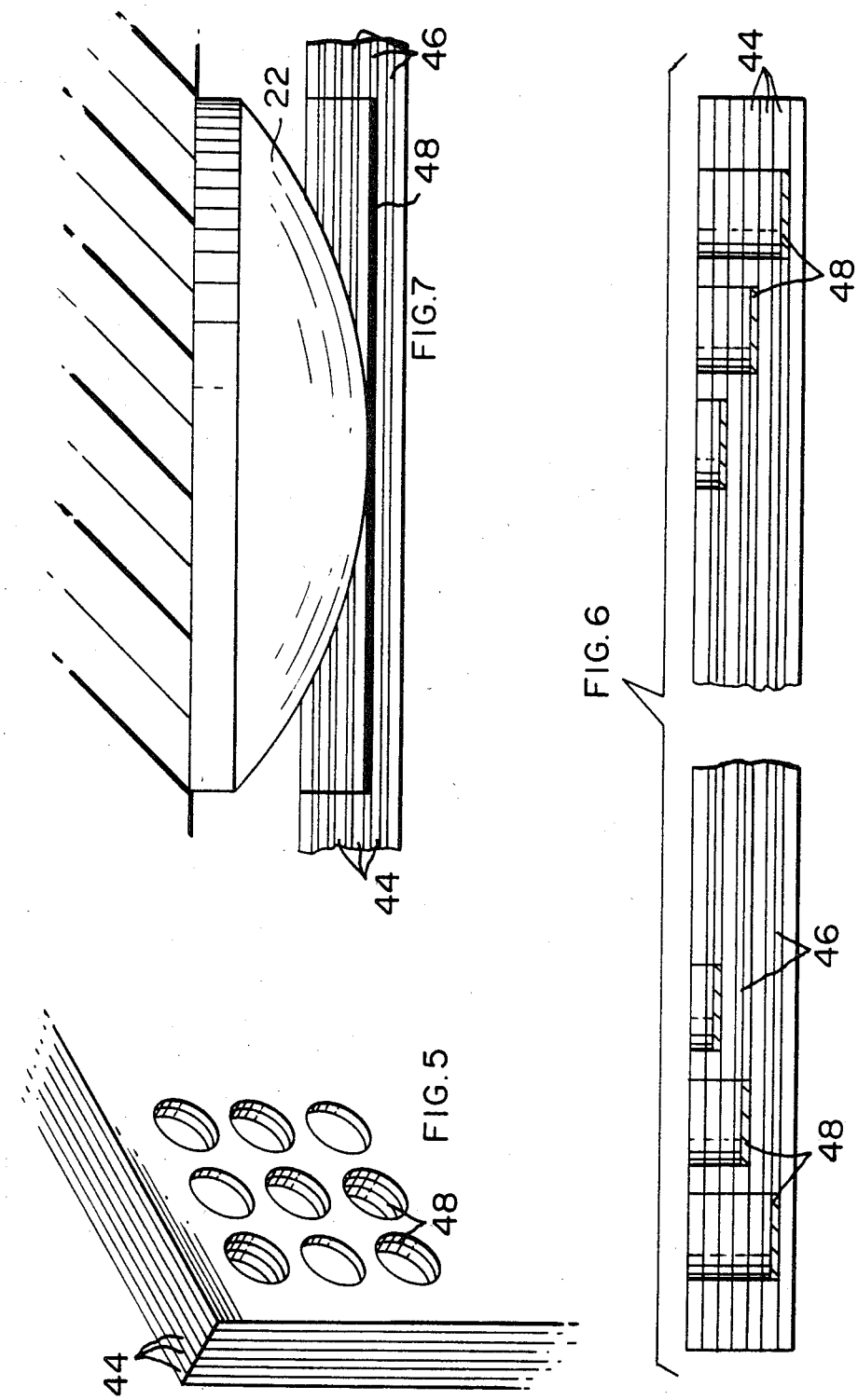

HIGH DENSITY MOTHER/DAUGHTER CIRCUIT BOARD CONNECTOR

The present invention relates to a zero insertion force, high density mother/daughter board connector and in particular to a connector employing multiple layers of flat flexible circuitry.

The trend in electronics has been to go to higher and higher densities of interconnects. This clearly limits the amount of space which is available for use in making the interconnect. Some of the previous attempts at making mother/daughter circuit board connectors having high density capabilities have utilized approaches involving the use of flat flexible circuitry. One example of this may be found in U.S. Pat. No. 3,401,369 which shows sheet of dielectric material one side of which is laminated to the inner surface of a channel-shaped spring member. The other surface of the sheet has a patterned array of conductive paths plated thereon. One end of each path is terminated by a pin terminal while the opposite end is spring-loaded by the channel-shaped member to engage an appropriate pad of a circuit board received in the connector. This connector has a number of disadvantages, including the fact that it is not zero insertion force and wiping forces of sufficient magnitude to damage the circuitry during insertion of a daughter circuit board can be generated.

Another board-to-board connector is shown in U.S. Pat. No. 3,967,162. This connector utilizes flat flexible circuitry which is patterned with an array of conductive paths and placed on the outside of an elastomeric member. The elastomeric member is placed between two stacked circuit boards and, when compressed together, will contact the circuit pattern such that a circuit on a first board will be connected to a circuit on a second board. The primary idea of this invention is to have a plurality of circuits such that there will be overlapping between the conductive paths and the circuit board pads to ensure connection is made between the circuit boards.

U.S. Pat. No. 3,609,463 discloses a further attempt at using flexible circuitry as a board-to-board interconnect. In this invention, a separate spring is used to drive a follower member against flexible circuitry to hold it in the insertion path of a circuit board. This is not a zero insertion force connector and is subject to the previously mentioned possible damage.

The present invention overcomes many of the difficulties of the prior art by providing a multi-layer flexible film mother/daughter circuit board connector which has zero insertion force and which can accommodate an extremely high density of interconnects between the mother circuit board and the daughter circuit board. The subject connector includes a housing defining a mother circuit board engaging surface and an elongated daughter board receiving recess, one side of which is formed as a cam reaction surface. A multi-layer flexible circuit is wrapped around the mother board engaging face of the housing and inserted into the daughter board receiving recess opposite the cam reaction surface. An elongated cam member is positioned in the recess in opposition to the multi-layer flexible circuitry and in engagement with the cam reaction surface to drive a daughter circuit board positioned in the recess transversely against the flexible circuitry. The multi-layer flexible circuitry is formed by a plurality of layers of flexible insulative material, at least some of which have a conductive pattern formed thereon to extend between first and second contact points. Various layers are apertured to expose the contact points of the inner or underlying layers of the flexible circuitry. Both the mother circuit board and daughter circuit board are preferably formed with contact pads which protrude from the surface of the respective circuit boards so as to readily enter the apertures in the multi-layered circuitry in such fashion as to make contact with the respective contact points therein.

The present invention will be described by way of example with reference to the accompanying drawings in which:

FIG. 5 is an enlarged detailed perspective view of and end portion of the multi-layer flexible circuit according to the present invention;

FIG. 6 is a side elevation detail, on an enlarged scale, of the end portions of the multi-layer flexible circuitry according to the present invention; and FIG. 7 is a schematic representation of the manner in which contact is made between a pad of one of the circuit boards and a contact point on the multi-layer flexible circuit.

Figure 1:
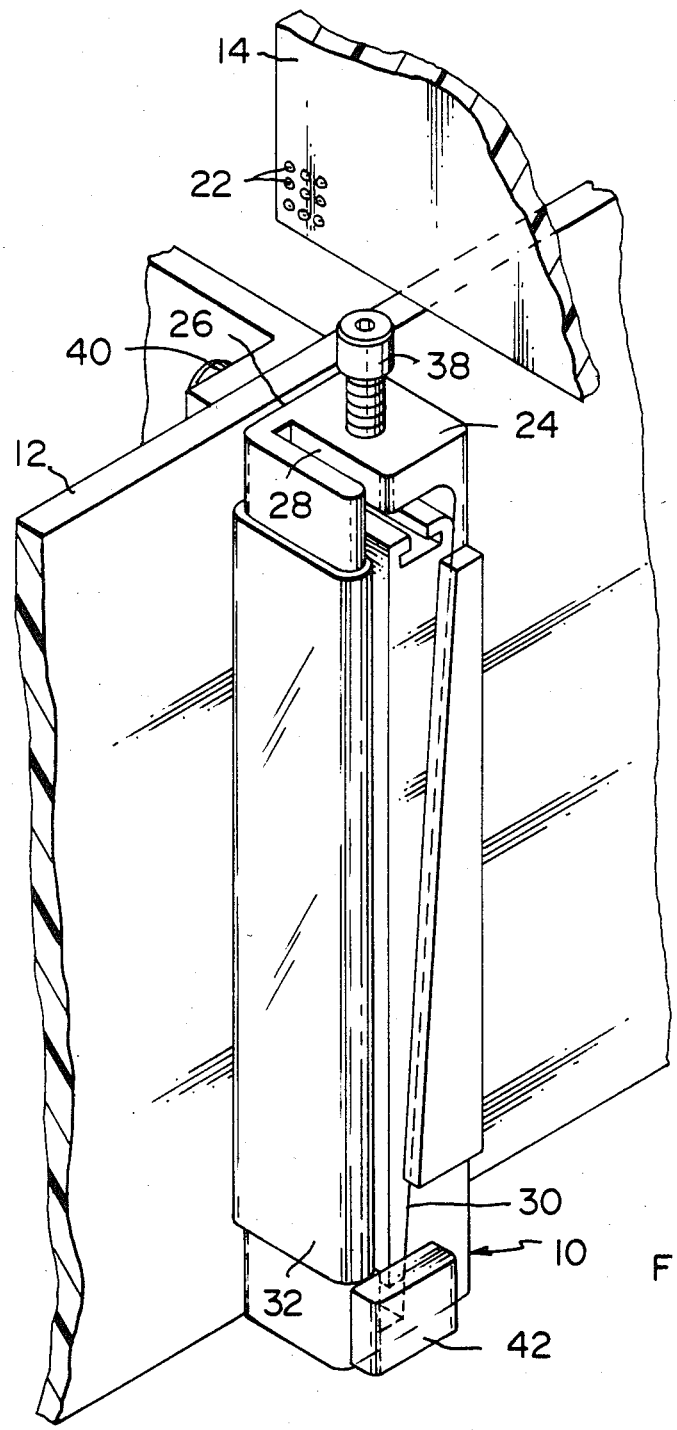
FIG. 1 is a perspective view of the subject invention.
Figure 2:
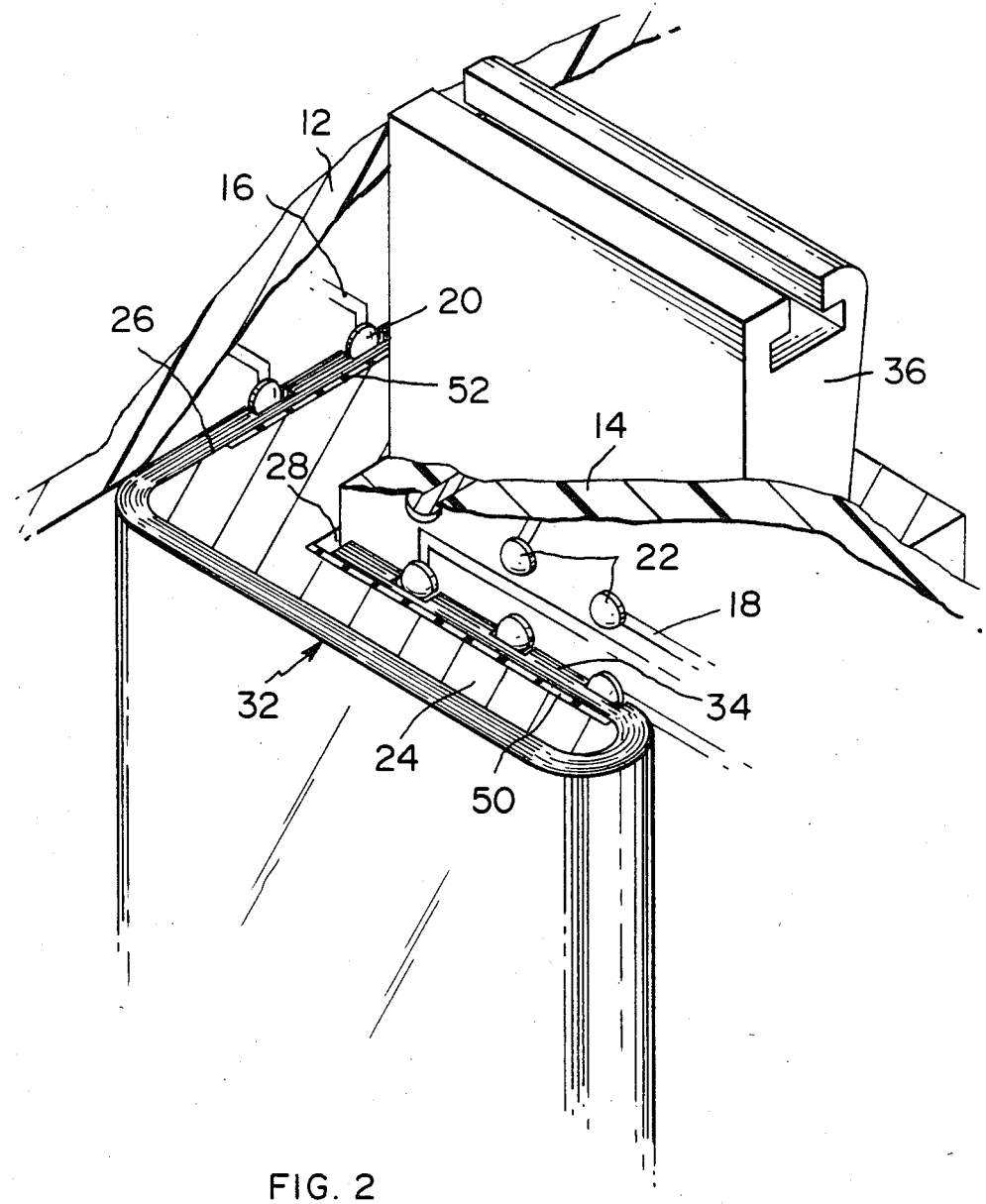
FIG. 2 is an enlarged detail, partially in section, of one end of the subject invention.
Figure 3:
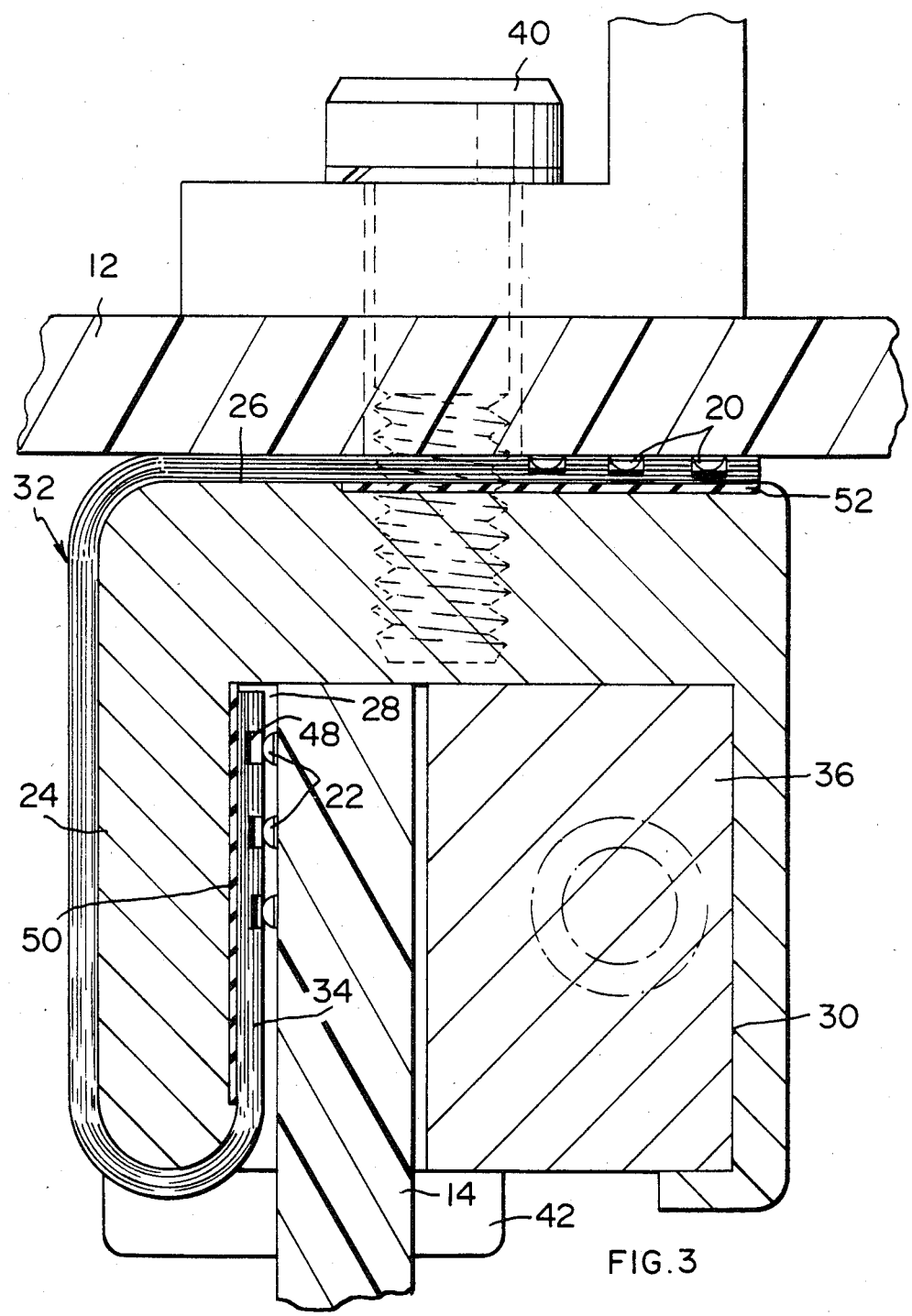
FIG. 3 is a transverse section through the subject invention in an open condition.
Figure 4:
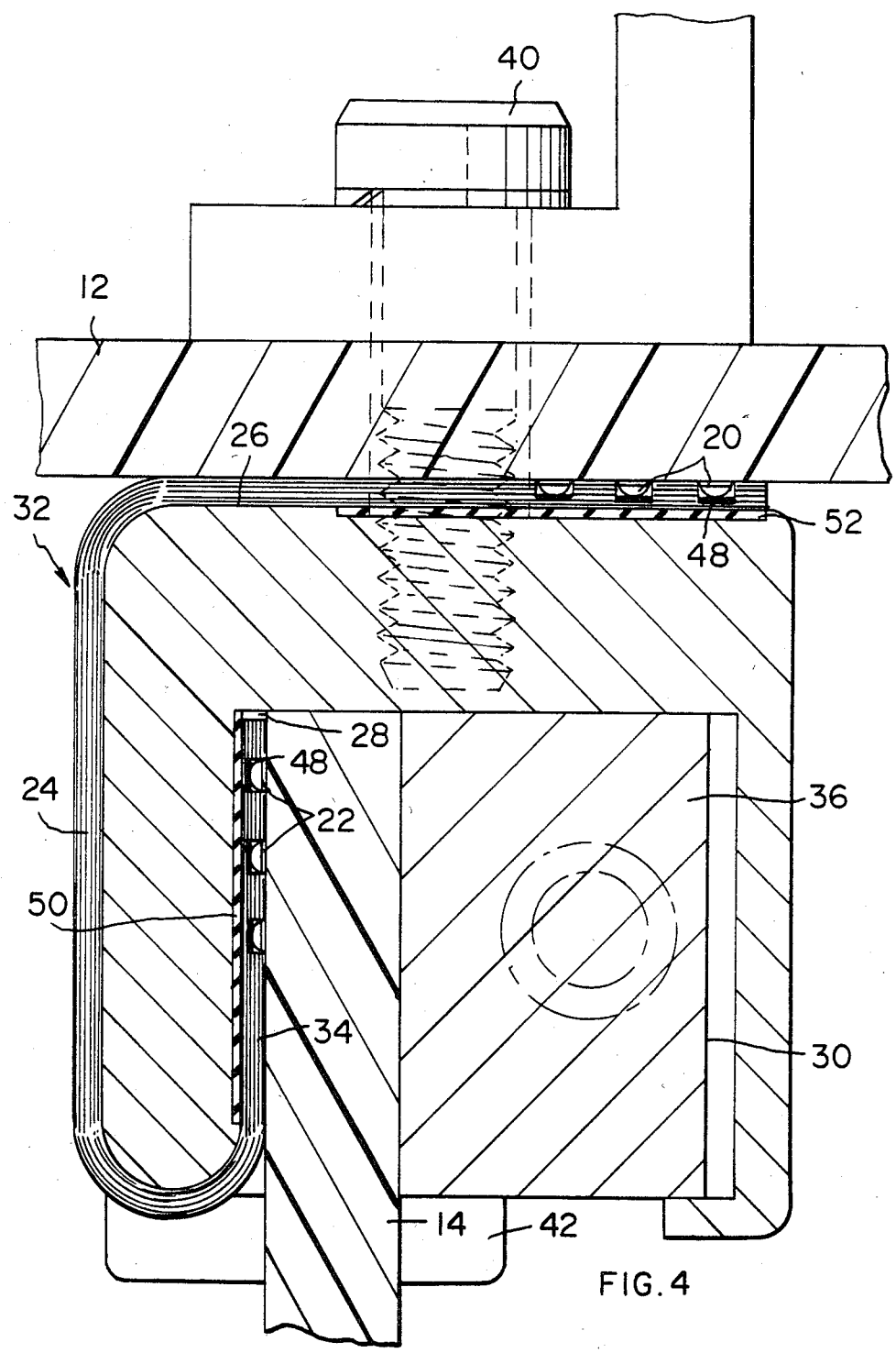
FIG. 4 is a transverse, similar of FIG. 3, showing the subject invention in a closed condition.

The present invention is a high density mother/daughter circuit board connector. Referring to FIGS. 1 and 2, the connector 10 is used to interconnect a mother circuit board 12 to a daughter circuit board 14 with each board being provided with circuitry 16, 18 respectively. The circuits of the respective boards are preferably terminated by a plurality of contact pads 20, 22 which protrude from the respective surfaces thereof in a patterned array. These could contact pads 20, 22 be in the form of a button or rivet which extends through the respective circuit boards 12, 14.

The connector 10 includes a housing 24 which is a generally elongated rectangular member having a mother circuit board face 26 and an elongated daughter board receiving recess 28, one side of which is formed as a cam reaction surface 30. A multi-layer flexible circuit 32 is wrapped around the face 26 of the housing 24 to lie the daughter board receiving recess 28 on the side 34 opposite the cam reaction surface 30. An elongated camming means 26 is also located in the recess 28 to engage against the reaction surface 30. The camming means 36 also includes any known cam actuation means 28, here shown as a screw. The housing 24 is provided with mounting means 40 for securing it against the mother circuit board 12. The housing 24 further has daughter circuit board locating means 42, such as the integral bridge shown in FIG. 1 to assure that the daughter circuit board is properly oriented with respect to the laminate 32. The housing 24 is preferably formed of insulative material.

The multi-layer flexible circuit 32 is best understood from FIGS. 5 through 7. It will be appreciated that the circuit 32 is formed by a plurality of layers of insulating material 44 with at least some of the layers provided with a pattern array of conductors 46 which extend between contact points 48 which are spaced apart on the respective layers but which are aligned with respective contact pads 20, 24 of the mother and daughter circuit boards 12, 14, respectively. One or more of the layers of insulative material are apertured to provide direct access to a contact point of an underlying circuit. It will be appreciated from FIG. 7 that the protruding pads 20, 22 of the circuit boards 12, 14 will extend through the apertures and contact only the exposed contact point 48 layer of the multi-layered flexible circuit 32.

The assembly of the present invention can best be understood from FIGS. 1 through 4. The flexible circuit 32 is wrapped around the housing 24 to overlie the mother circuit board face 26 and to extend into the daughter board receiving recess 28 against side 34. The camming means 26 is inserted into the recess 28 against the reaction surface 30 and the thus formed assembly is then secured to the mother circuit board 12 by mounting means 40. The daughter board 14 is then inserted into the recess 28, with low or no insertion force. When the daughter circuit board 14 is fully inserted and properly position, engaging both the bottom of recess 28 and locating means 42, the cam actuation means 28 is activated to drive the cam 36 against the rear surface of the daughter circuit board 14 driving its mating face into engagement with the multi-layer flat flexible circuitry 32. As previously mentioned, the pads 22 are of sufficient dimension to make contact with the respective contact points 48. Either or both ends of flexible circuit 32 can be supported on resilient pads 50, 52.

It will be appreciated by those skilled in the art that the present invention is susceptible to a number of variations including different types of camming actions, alignment and centering means, and even two-sided daughter board connection by relocation and doubling of the camming means.

I claim:

1. A high density mother/daughter circuit board connector comprising:
    an elongated housing defining a mother circuit board engaging face and an oppositely-directed elongated daughter circuit board receiving recess at least one elongated side of which is profiled to form a cam reaction surface;
    elongated cam means in said recess engaging said cam reaction surface;
    means to drive said elongated cam means with respect to said cam reaction surface;
    a multi-layer flexible circuit wrapped around said housing from said face to extend into said recess and defining a plurality of circuit paths each with a contact point at said face and in said recess;
    conductors on a plurality of individual layers of said multi-layer flexible circuit extending between first and second contact points; and
    projections on said mother and daughter boards for electrically contacting the contact points.

2. An electrical connector according to claim 1 wherein said multi-layer flexible circuit comprises a plurality of layers of flexible insulating material at least some of which have patterned arrays of conductors thereon extending between first and second spaced contact points, at least some of said layers of insulating material being apertured to expose the underlying contact points.

3. The connector according to claim 1 wherein said contact pads of said mother and said daughter circuit boards project above the plane of the respective boards with a substantially dome-like configuration whereby contact points of said flexible circuit are wrapped.

4. The electrical connector according to claim 1 wherein said mother circuit board and said daughter circuit board are each apertured at their points for making electrical contact, each aperture having therein a rivet-like metal conductor forming a dome-shaped head on one surface of said board, whereby contact points of said flexible circuit are engaged.

5. The electrical connector according to claim 1 further comprising:
    means to mount said housing on said mother circuit board.

6. The electrical connector according to claim 1 further comprising:
    means to locate said daughter circuit board in said recess.

7. The electrical connector according to claim 1 wherein said housing is formed to insulative material.

8. The electrical connector according to claim 1 wherein said circuit paths of said multi-layer flexible circuit are so dimensioned and located as to improve the electrical characteristics of said connector.

9. The electrical connector according to claim 1 wherein said multi-layer flexible circuit provides impedance matching.

* * * * *